(12) United States Patent
Procopio et al.

(10) Patent No.: US 10,197,795 B2
(45) Date of Patent: Feb. 5, 2019

(54) MEMS DEVICE WITH PIEZOELECTRIC ACTUATION, A PROJECTIVE MEMS SYSTEM INCLUDING THE MEMS DEVICE AND RELATED DRIVING METHOD

(71) Applicant: STMicroelectronics S.r.l., Agrate Brianza (IT)

(72) Inventors: Francesco Procopio, Sedriano (IT); Giulio Ricotti, Broni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/588,204

(22) Filed: May 5, 2017

(65) Prior Publication Data

US 2018/0149859 A1     May 31, 2018

(30) Foreign Application Priority Data

Nov. 29, 2016   (IT) .................. 102016000121010

(51) Int. Cl.
| G02B 26/08 | (2006.01) |
| G03B 21/00 | (2006.01) |
| H01L 41/04 | (2006.01) |
| H01L 41/09 | (2006.01) |

(52) U.S. Cl.
CPC ....... *G02B 26/0858* (2013.01); *G03B 21/008* (2013.01); *H01L 41/042* (2013.01); *H01L 41/09* (2013.01)

(58) Field of Classification Search
None
See application file for complete search history.

(56) References Cited

U.S. PATENT DOCUMENTS

| 2007/0269199 A1* | 11/2007 | Mori .................. G02B 26/0858 396/322 |
| 2012/0152001 A1* | 6/2012 | Reichel .................. G01N 11/16 73/54.41 |
| 2013/0208330 A1 | 8/2013 | Naono |

FOREIGN PATENT DOCUMENTS

| EP | 1857855 A2 | 11/2007 |
| EP | 2827183 A1 | 1/2015 |
| JP | 2014232176 A | 12/2014 |

OTHER PUBLICATIONS

IT Search Report and Written Opinion for IT 20160000121010 dated Jul. 24, 2017 (7 pages).

* cited by examiner

*Primary Examiner* — Jennifer D. Carruth
(74) *Attorney, Agent, or Firm* — Crowe & Dunlevy

(57) ABSTRACT

A MEMS device includes a fixed supporting body forming a cavity, a mobile element suspended over the cavity, and an elastic element arranged between the fixed supporting body and the mobile element. First, second, third, and fourth piezoelectric elements are mechanically coupled to the elastic element, which has a shape symmetrical with respect to a direction. The first and second piezoelectric elements are arranged symmetrically with respect to the third and fourth piezoelectric elements, respectively. The first and fourth piezoelectric elements are configured to receive a first control signal, whereas the second and third piezoelectric elements are configured to receive a second control signal, which is in phase opposition with respect to the first control signal so that the first, second, third, and fourth piezoelectric elements deform the elastic element, with consequent rotation of the mobile element about the direction.

24 Claims, 6 Drawing Sheets

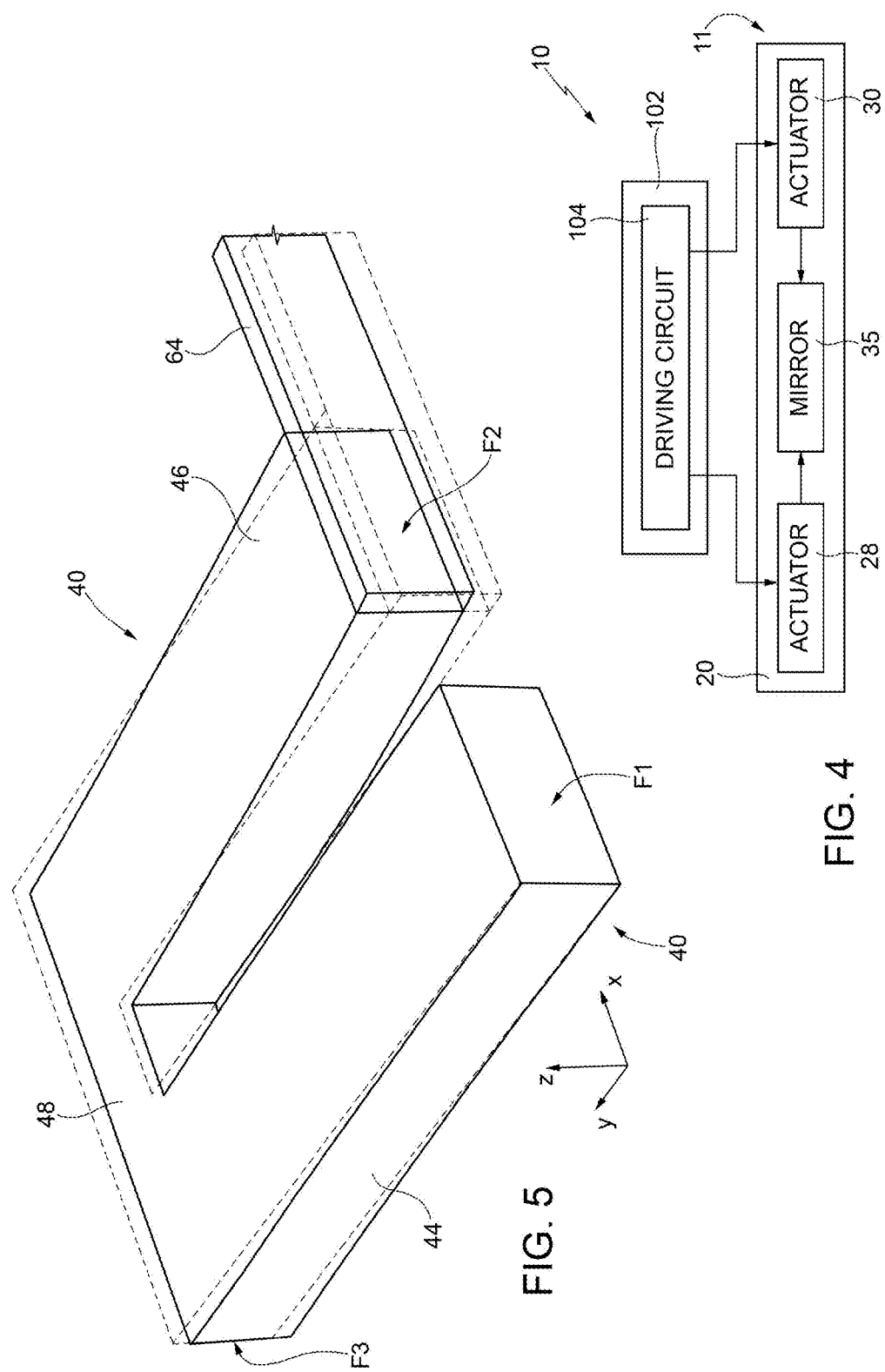

MEMS DEVICE WITH PIEZOELECTRIC ACTUATION, A PROJECTIVE MEMS SYSTEM INCLUDING THE MEMS DEVICE AND RELATED DRIVING METHOD

PRIORITY CLAIM

This application claims the priority and benefit of Italian Application for Patent No. 102016000121010, filed on Nov. 29, 2016, the disclosure of which is hereby incorporated by reference in its entirety.

TECHNICAL FIELD

This disclosure relates to a device of the so-called MEMS (Micro-Electro-Mechanical Systems) type with piezoelectric actuation. Further, this disclosure relates to a projective MEMS system including the MEMS device, as well as to a method for driving the MEMS device.

BACKGROUND

There are numerous MEMS devices on the market at the present time. In particular, MEMS reflectors are known, and are designed to receive an optical beam and to vary the direction of propagation thereof, in a periodic or quasi-periodic way. For this purpose, MEMS reflectors include mobile elements formed by mirrors, the spatial positions of which are controlled electronically.

In order to move the mirrors, MEMS reflectors are typically provided with electrostatic actuators. However, electrostatic actuators operate with high voltages and further present a limited linearity.

Therefore, development a MEMS device that will solve at least in part the drawbacks described above is desirable.

SUMMARY

Disclosed herein is a MEMS device that includes a fixed supporting body forming a cavity with a mobile element suspended over the cavity. At least one elastic element is arranged between the fixed supporting body and the mobile element. First, second, third, and fourth piezoelectric elements are mechanically coupled to the at least one elastic element. The at least one elastic element has a shape symmetrical with respect to a first direction, which defines a first part and a second part of the at least one elastic element. The first and second piezoelectric elements are arranged on the first part, symmetrically with respect to the third and fourth piezoelectric elements, respectively, which are arranged on the second part. The first and fourth piezoelectric elements are configured to receive a first control signal. The second and third piezoelectric elements are configured to receive a second control signal, the first and second control signals being opposite in phase so that the first, second, third, and fourth piezoelectric elements deform the at least one elastic element, with consequent rotation of the mobile element, with respect to the fixed supporting body, about the first direction.

The at least one elastic element may have an annular shape and may include a first transverse portion and a second transverse portion which extend parallel to a second direction, transverse with respect to the first direction. The at least one elastic element may also include a first connecting portion and a second connecting portion, each of which connects corresponding ends of the first and second transverse portions. The first and third piezoelectric elements may be arranged on the first transverse portion, the second and fourth piezoelectric elements may be arranged on the second transverse portion.

The first and second transverse portions may form, respectively, a first intermediate portion which is connected to the fixed supporting body, and a second intermediate portion which is aligned with the first intermediate portion in the first direction and is fixed to the mobile element, with the second intermediate portion being configured to rotate, in use, with respect to the fixed supporting body.

In resting conditions, each of the first, second, third and fourth piezoelectric elements may have an elongated shape parallel to the second direction. The first and third piezoelectric elements may be laterally staggered with respect to the first intermediate portion, and the second and fourth piezoelectric elements may be laterally staggered with respect to the second intermediate portion.

The second direction may be perpendicular to the first direction, and the at least one elastic element may have a thickness, measured along a third direction perpendicular to the first and second directions, that is smaller than two other dimensions, measured along the first and second directions.

The fixed supporting body, the at least one elastic element, and the mobile element may be made of semiconductor material.

A driving circuit may be electrically coupled to the first, second, third, and fourth piezoelectric elements and configured to generate the first and second control signals.

The fixed supporting body, the mobile element, the at least one elastic element, and the first, second, third, and fourth piezoelectric elements may be formed in a first die, and the driving circuit may be formed in a second die.

A mirror may be affixed to the mobile element.

BRIEF DESCRIPTION OF THE DRAWINGS

For better understanding, preferred embodiments are now described, purely by way of non-limiting example, with reference to the attached drawings, wherein:

FIG. 4 shows a block diagram of a MEMS system;

FIG. 5 is a schematic perspective view of a portion of the MEMS device shown in FIG. 2, in use;

DETAILED DESCRIPTION

In what follows, the devices and methods developed by the Inventors are described, purely by way of example, with reference to the case of a MEMS device designed to reflect an optical beam in an electronically controllable way, and thus including at least one mirror. Other uses of the MEMS are, however, possible, as described hereinafter.

Figure 1:
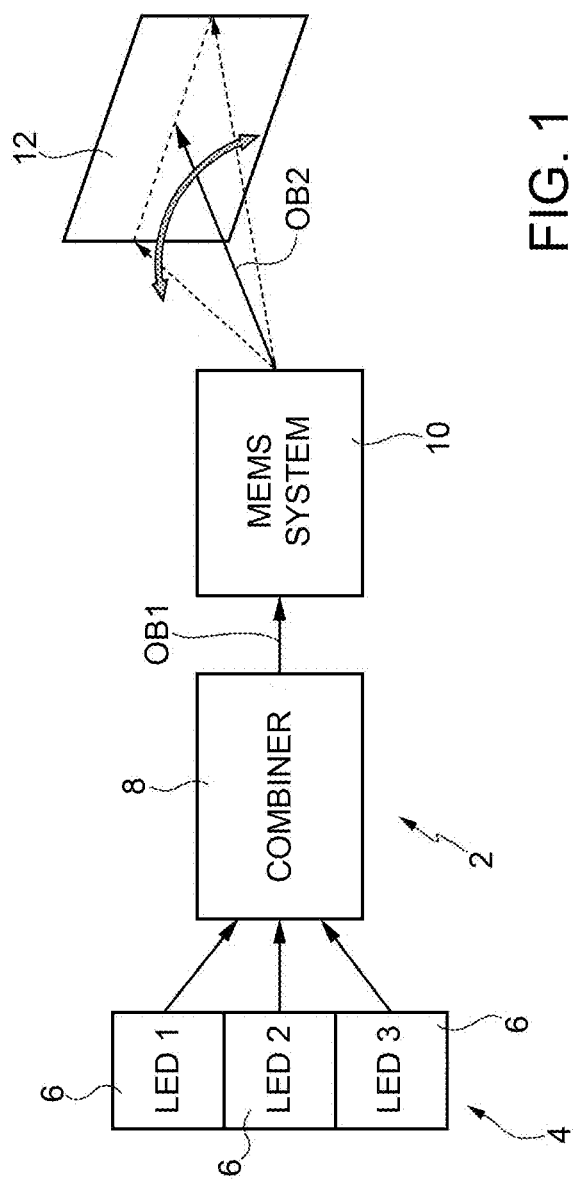
FIG. 1 shows a block diagram of a projective system.

FIG. 1 shows a projective system 2, which includes a light source 4 formed by a plurality of LEDs 6, each of which emits electromagnetic radiation at a corresponding wavelength. For example, FIG. 1 shows three LEDs 6, each of which emits radiation, respectively, around red (620-750 nm), green (495-570 nm), and blue (450-475 nm).

The projective system 2 further comprises a combiner 8, a MEMS system 10, and a screen 12. The combiner 8 is arranged downstream of the light source 4 so as to receive the electromagnetic radiation emitted by the LEDs 6 and to form a single optical beam OB1, obtained by combination of this electromagnetic radiation. The combiner 8 is further designed to direct the optical beam OB1 onto the MEMS system 10. In turn, the MEMS system 10, described in greater detail hereinafter, is designed to generate a reflected optical beam OB2 and to send the reflected optical beam OB2 onto the screen 12 so as to enable formation of images on the screen 12.

In detail, the MEMS system 10 is designed to vary in time the orientation in space of the axis of the reflected optical beam OB2 so as to scan periodically portions of the screen 12. In particular, the reflected optical beam OB2 linearly scans a portion of the screen 12, possibly all of it.

Figure 2:
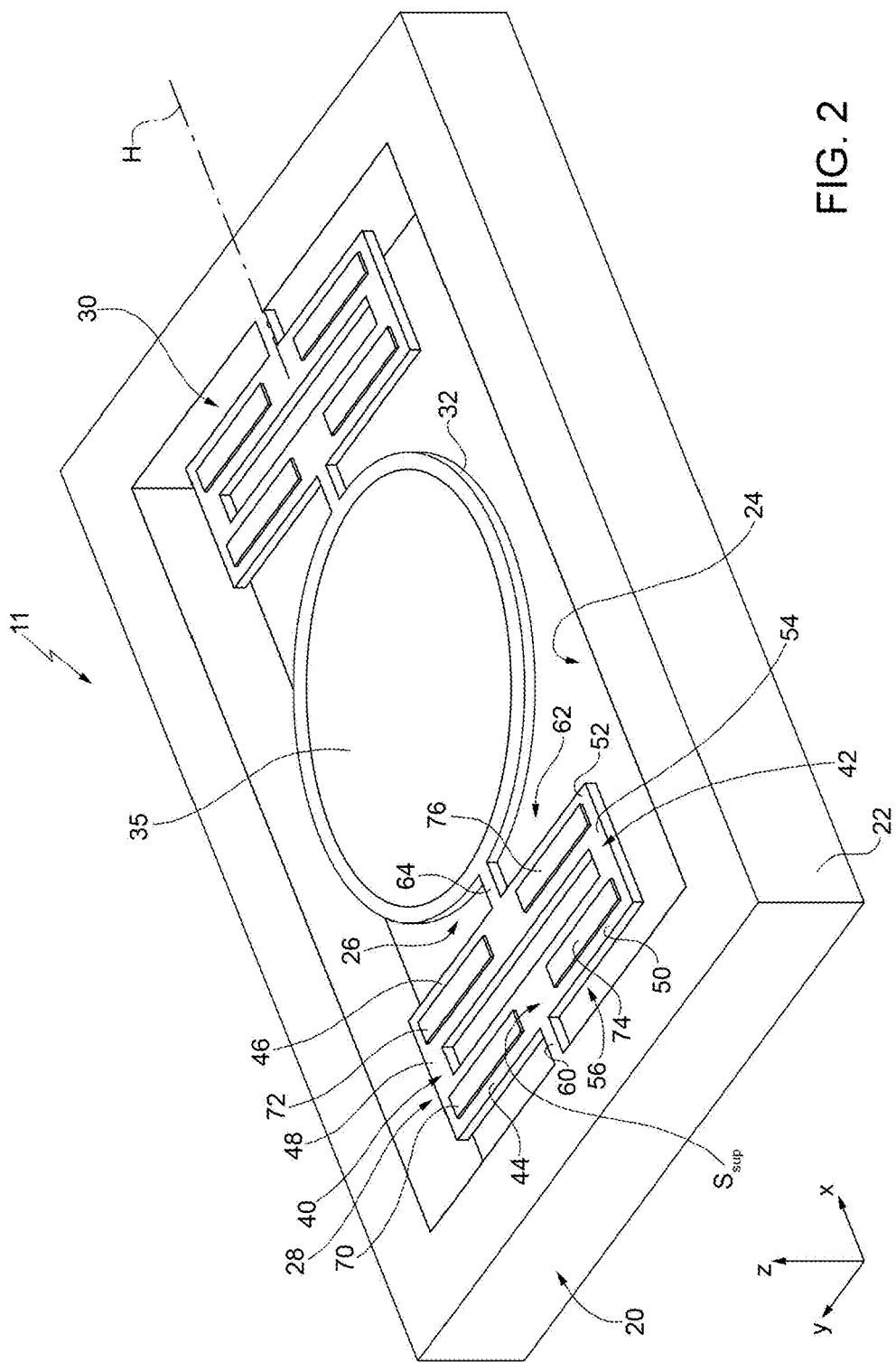
FIG. 2 is a schematic perspective view with portions removed of a MEMS device.

As shown in FIG. 2, the MEMS system 10 comprises a MEMS device 11, which is formed in a first die 20 and comprises a fixed supporting body 22 of semiconductor material (for example, silicon), which defines a cavity 24.

The MEMS device 11 further comprises a mobile body 26, which is constrained, at its own ends, to the fixed supporting body 22 and is suspended over the cavity 24.

The mobile body 26 is formed by a first deformable actuator 28 and a second deformable actuator 30, as well as by a mobile element 32, which is connected between the first and second deformable actuators 28, 30. In turn, the first and second deformable actuators 28, 30 are constrained to the fixed supporting body 22.

The mobile element 32 carries a mirror 35 of a plane type, made, for example, of a film of metal material, such as aluminum. The mirror 35 is fixed to the mobile element 32 and is designed to receive the optical beam OB1 coming from the combiner 8 and to generate the reflected optical beam OB2. Further, the mobile element 32, and thus the mirror 35, is designed to rotate about an axis H, as described hereinafter.

In what follows, the first deformable actuator 28 is described, the second deformable actuator 30 being the same as the first deformable actuator 28. Further, an orthogonal reference system formed by three axes x, y, z is assumed such that the axis x is parallel to the axis H, whereas the axis z is perpendicular to the surface defined by the mirror 35, in resting conditions.

In detail, the first deformable actuator 28 comprises a first semiconductive part 40 and a second semiconductive part 42, which are arranged symmetrically with respect to the axis H (more precisely, with respect to a plane parallel to the plane xz and passing through the axis H). Further, the first and second semiconductive parts 40, 42 form a single piece of semiconductor material; i.e., they form a monolithic structure of semiconductor material, which acts as a spring.

In greater detail, the first and second semiconductive parts 40, 42 are C-shaped so that the spring formed by them has an annular shape, parallel to the plane xy. Further, the first and second semiconductive parts 40, 42 have a thickness, for example, of 25 µm.

In even greater detail, the first semiconductive part 40 of the first deformable actuator 28 comprises a first elongated portion 44 and a second elongated portion 46, which, in resting conditions, extend parallel to the y axis for the same length and have a parallelepipedal shape. In practice, each of the first and second elongated portions 44, 46 has a first end, close to the axis H, and a second end. Further, the first semiconductive part 40 of the first deformable actuator 28 comprises a first connecting portion 48, which also has a parallelepipedal shape and extends parallel to the x axis, connecting together the second ends of the first and second elongated portions 44, 46.

The second semiconductive part 42 of the first deformable actuator 28 comprises a third elongated portion 50 and a fourth elongated portion 52, which, in resting conditions, extend parallel to the y axis, with a length equal to the length of the first and second elongated portions 44, 46, and have a parallelepipedal shape. In particular, in resting conditions, the third and fourth elongated portions 50, 52 are arranged symmetrically with respect to the first and second elongated portions 44, 46, respectively. In general, when in the present description reference is made to symmetry, it is understood that the axis of symmetry coincides with the axis H, except where otherwise specified.

The third and fourth elongated portions 50, 52 thus have corresponding first ends, which are close to the axis H and contact, respectively, the first end of the first elongated portion 44 and the first end of the second elongated portion 46. Further, the second semiconductive part 42 of the first deformable actuator 28 comprises a second connecting portion 54, which also has a parallelepipedal shape and extends parallel to the axis x, connecting together the second ends of the third and fourth elongated portions 50, 52. In resting conditions, the first and second connecting portions 48, 54 are arranged symmetrically.

The first and third elongated portions 44, 50 of the first deformable actuator 28 thus form a first transverse element 56, which in resting conditions has an elongated shape parallel to the y axis. An intermediate portion of the first transverse element 56, which forms the aforementioned first ends of the first and third elongated portions 44, 50, is connected to a first end of a first coupling element 60, which has an elongated shape parallel to the x axis; a second end of the first coupling element 60 is fixed to the fixed supporting body 22. The first and third piezoelectric elements 70, 74 are laterally staggered with respect to the intermediate portion of the first transverse element 56.

The second and fourth elongated portions 46, 52 of the first deformable actuator 28 form a second transverse element 62, which in resting conditions has an elongated shape parallel to the y axis. An intermediate portion of the second transverse element 62, which forms the aforementioned first ends of the second and fourth elongated portions 46, 52, is connected to a first end of a second coupling element 64, which has an elongated shape parallel to the x axis. A second end of the second coupling element 64 is fixed to the mobile element 32. The second and fourth piezoelectric elements 72, 76 are laterally staggered with respect to the intermediate portion of the second transverse element 62, which is aligned with the intermediate portion of the first transverse element 56 along the H axis.

In practice, in resting conditions, the spring formed by the first and second semiconductive parts 40, 42 has a rectangular shape, elongated parallel to the y axis, in a top plan view. Further, this spring has a thickness (measured along the z axis) that is smaller than the other two dimensions.

In resting conditions, the first and second coupling elements 60, 64 are aligned along the H axis. Further, the first and second coupling elements 60, 64 form a single piece of semiconductor together with the first and second semiconductive parts 40, 42 of the first deformable actuator 28 and with the mobile element 32, as well as together with corresponding portions of the second deformable actuator 30, this piece of semiconductor being delimited by a top surface $S_{sup}$ and having a substantially constant thickness.

The first deformable actuator 28 further comprises a first piezoelectric element 70, a second piezoelectric element 72, a third piezoelectric element 74, and a fourth piezoelectric element 76, which are made of piezoelectric material (for example, PZT or AlN) and have, to a first approximation, the same shape (a roughly parallelepipedal shape). For reasons of clarity, in FIG. 2 these piezoelectric elements are arranged on the top surface $S_{sup}$, even though the practical implementation is, for example, of the type represented in FIG. 3, which shows, by way of example, the first and third piezoelectric elements 70, 74.

Figure 3:
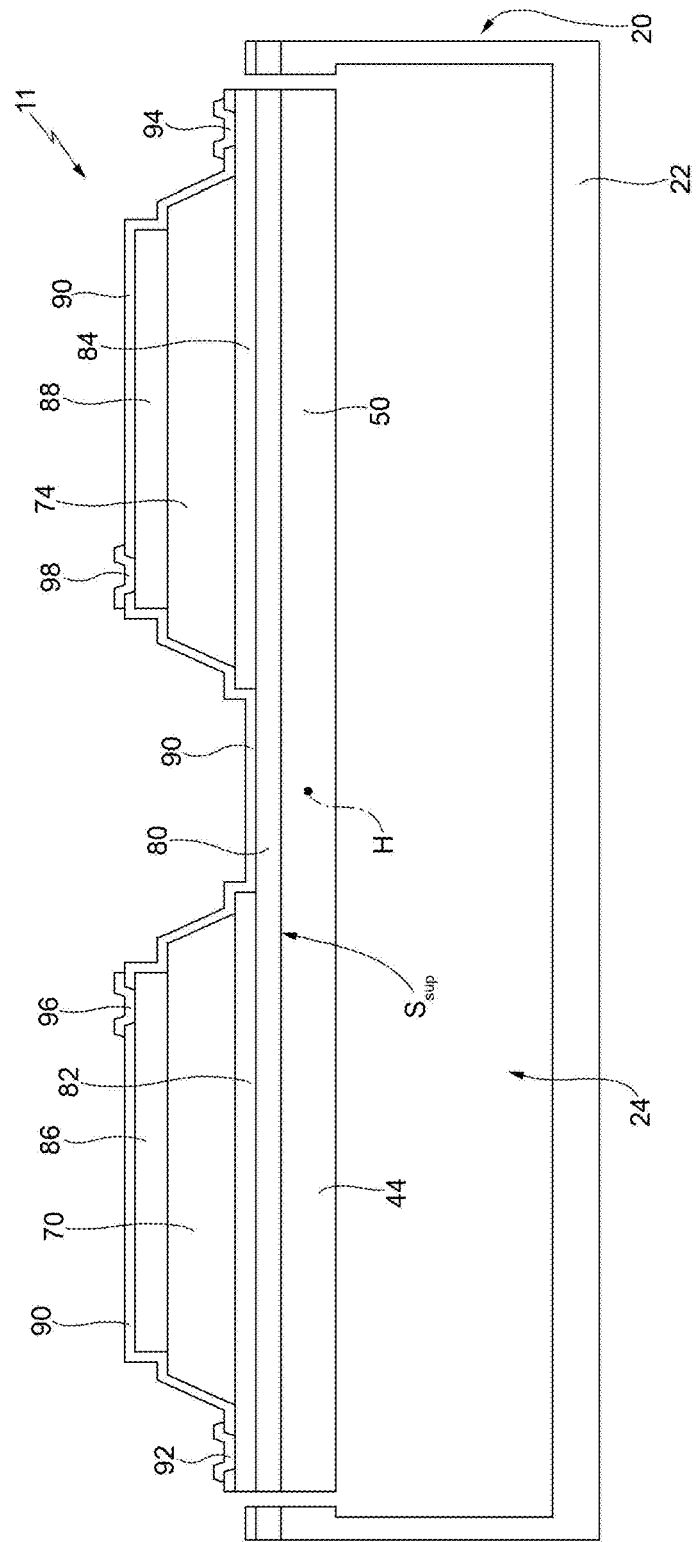
FIG. 3 is a schematic cross-sectional view of the MEMS device shown in FIG. 2.

In detail, FIG. 3 shows how there is present on the top surface $S_{sup}$ a dielectric layer 80 that is made, for example, of thermal oxide and has a thickness, for example, of 0.5 μm, extending over which are a first bottom electrode region 82 and a second bottom electrode region 84, which are made of conductive material (for example, an alloy of titanium dioxide and platinum), having a thickness, for example, of 100 nm and are laterally staggered along the y axis, so as to overlay, respectively, the first and third elongated portions 44, 50. The first and third piezoelectric elements 70, 74 extend, respectively, over the first and second bottom electrode regions 82, 84 and are respectively overlaid by a first top electrode region 86 and a second top electrode region 88, which are made of conductive material (for example, titanium) and have a thickness of, for example, 100 nm. FIG. 3 further shows a protective layer 90 of dielectric material (for example, silicon oxide or silicon nitride), which extends over the exposed portions of the first and second bottom electrode regions 82, 84, of the first and third piezoelectric elements 70, 74, and of the first and second top electrode regions 86, 88. Further, FIG. 3 shows a first bottom electrode contact 92 and a second bottom electrode contact 94, which extend through the protective layer 90 so as to contact, respectively, the first and second bottom electrode regions 82, 84. FIG. 3 likewise shows a first top electrode contact 96 and a second top electrode contact 98, which traverse the protective layer 90 so as to contact the first and second top electrode regions 86, 88, respectively.

As shown in FIG. 4 and as described in greater detail hereinafter, the MEMS system 10 further comprises a second die 102, formed inside which is a driving circuit 104, which is electrically connected to the first and second deformable actuators 28, 30.

The driving circuit 104 generates control signals that are applied to the first and second deformable actuators 28, 30, and thus to the corresponding piezoelectric elements, through the corresponding top and bottom electrode contacts. The details regarding the control signals are described hereinafter, limitedly to the control signals sent to the first deformable actuator 28, by way of example.

Once again with reference to FIG. 2, the first and second piezoelectric elements 70, 72 are arranged in a symmetrical way with respect to the third and fourth piezoelectric elements 74, 76, respectively. Further, the first and second piezoelectric elements 70, 72 are arranged symmetrically to one another with respect to a direction orthogonal to the H axis. Also the third and fourth piezoelectric elements 74, 76 are arranged symmetrically to one another, with respect to this direction orthogonal to the H axis. On the other hand, the spring itself formed by the first and second semiconductive parts 40, 42 is symmetrical also with respect to this direction orthogonal to the H axis. However, in general the symmetry with respect to the aforementioned direction orthogonal to the H axis is optional.

Assuming that the mirror 35 is driven so as to oscillate with a certain period of oscillation, the first and fourth piezoelectric elements 70, 76 are driven with a first control signal, generated by the driving circuit 104, whereas the second and third piezoelectric elements 72, 74 are driven by a second control signal, which is also generated by the driving circuit 104. The first and second control signals are signals of an a.c. type, with a zero mean value (i.e., they are bipolar signals), with period equal to the period of oscillation and in phase opposition with respect to one another. Consequently, the first and fourth piezoelectric elements 70, 76 are driven in phase with respect to one another, as likewise the second and third piezoelectric elements 72, 74.

In what follows, operation of the first deformable actuator 28 is described, initially, with reference to the first semiconductive part 40, assuming a scenario of the type shown in FIG. 5, where the second semiconductive part 42 is absent. In this scenario, the first end of the first elongated portion 44 is delimited by a first face F1, whereas the first end of the second elongated portion 46 is delimited by a second face F2. The second ends of the first and second elongated portions 44, 46 and the first connecting portion 48 are, instead, delimited by a third face F3. In resting conditions (represented dashed in FIG. 5), the first and second faces F1, F2 are coplanar and parallel to the plane xz; the third face F3 is parallel to the first and second faces F1, F2; further, the first, second, and third faces F1, F2, and F3 are at a same height. Even though it is not visible in FIG. 5, the first face F1 is fixed to the fixed supporting body 22 and does not vary its own arrangement with respect to the latter, whereas the arrangements of the second and third faces F2, F3 with respect to the fixed supporting body 22 may vary following upon deformation of the first semiconductive part 40. In addition, the second coupling element 64 is fixed to the second face F2 and may rototranslate with respect to the position assumed in resting conditions, as described hereinafter.

This having been said, FIG. 5 regards an instant when the first and second control signals are such that the first piezoelectric element 70 (not visible in FIG. 5, for simplicity of representation) lengthens with respect to the underlying first bottom electrode region 82, whereas the second piezoelectric element 72 (not visible in FIG. 5) shortens with respect to the underlying second bottom electrode region 84. The deformations to which the first and second piezoelectric elements 70, 72 are subject cause corresponding deformations of the underlying first and second elongated portions 44, 46, visible in FIG. 5.

In detail, the first elongated portion 44 is still parallel to the plane yz, but is curved, so that third face F3 is lower by an amount Δz' with respect to what occurs in resting conditions. In this connection, reference will be made to the height of a face to indicate the height of the corresponding geometrical center; further, to a first approximation it is assumed that, following upon application of the control signals, the faces rototranslate without undergoing deformation.

In greater detail, the third face F3 is also rotated by an amount Δrot' (in the clockwise direction, as viewed from the mobile element 32) with respect to what occurs in resting conditions. In other words, it is found that, with respect to the resting conditions, the geometrical center of the third face F3 has dropped by an amount equal to Δz', and further the plane in which the third face F3 lies defines an angle equal to Δrot' with respect to the plane (parallel to the plane xz) in which the third face F3 lay in resting conditions. In practice, rototranslation of the third face F3 is due to deformation of the first piezoelectric element 70 and to the consequent curving downwards of the first elongated portion 44.

In addition, the simultaneous deformation of the second piezoelectric element 72 causes the second elongated portion 46 to curve upwards. In particular, with respect to the resting conditions, the second face F2 has risen by an amount $\Delta z''$ and has rotated by an amount $\Delta rot''$ (in the clockwise direction, as viewed from the mobile element 32).

Figure 6:
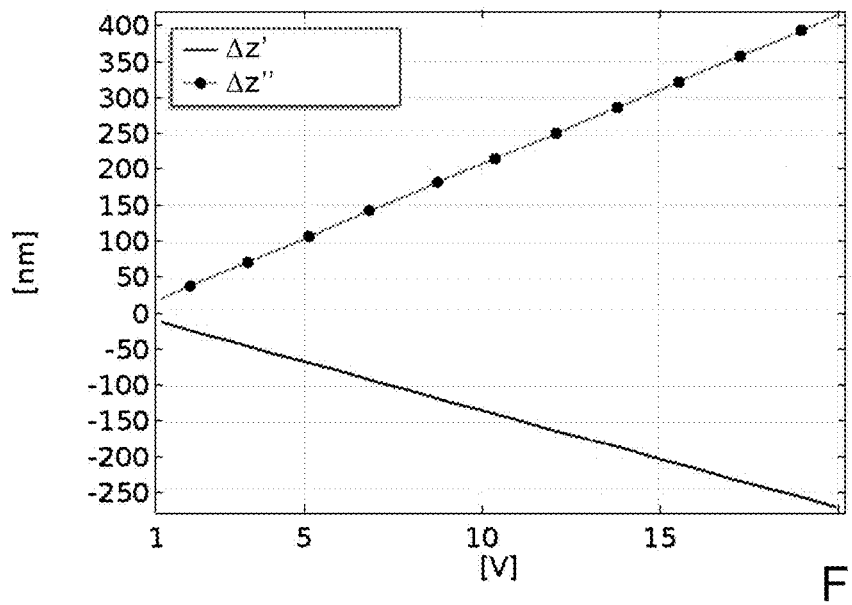
FIG. 6 shows examples of plots of deviations to which, in use, portions of the MEMS device shown in FIG. 2 are subject, as a function of a voltage.
Figure 7:
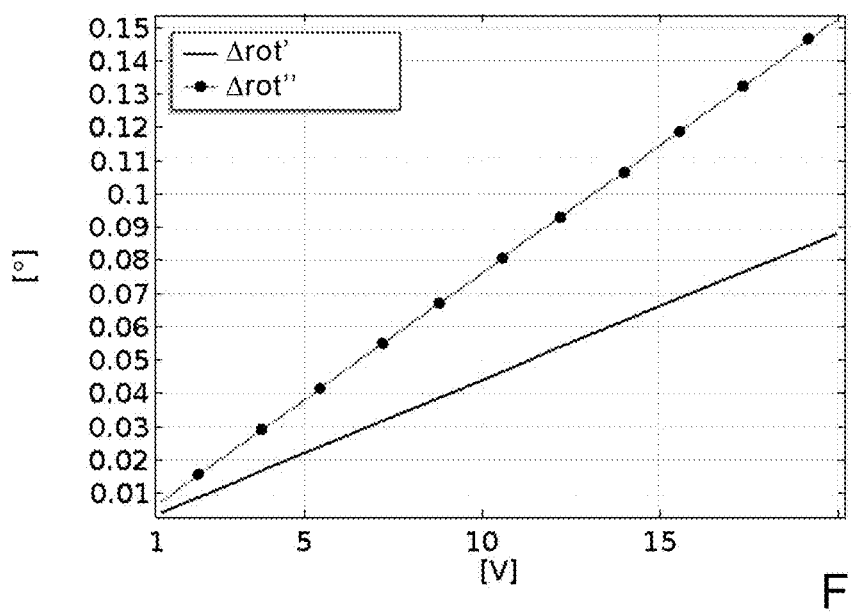
FIG. 7 shows examples of plots of rotations to which, in use, portions of the MEMS device shown in FIG. 2 are subject, as a function of a voltage.

Examples of plots of the amounts $\Delta z'$, $\Delta z''$, $\Delta rot'$, and $\Delta rot''$ as a function of the modulus of the voltage applied to the first and second piezoelectric elements 70, 72 are given in FIGS. 6 and 7. In particular, it may be noted how, given the same voltage, the deviations and rotations of the second face F2 are almost twice the corresponding deviations/rotations of the third face F3. Since the second coupling element 64 and the mobile element 32 (and thus the mirror 35) may be assumed undeformable and fixed with respect to the second face F2, it follows that, in the absence of the second semiconductive part 42, it is possible to obtain a good rotation of the mirror 35, but at the cost of a non-negligible translation of the axis H, this translation (parallel to the axis z) being generally undesired.

The presence of the second semiconductive part 42 enables the aforementioned drawback to be obviated, for the following reasons.

The behavior of the second semiconductive part 42 is similar to the behavior of the first semiconductive part 40, since, as mentioned previously, the third and fourth piezoelectric elements 74, 76 are driven with control signals reversed with respect to those of the first and second piezoelectric elements 70, 72.

Figure 8:
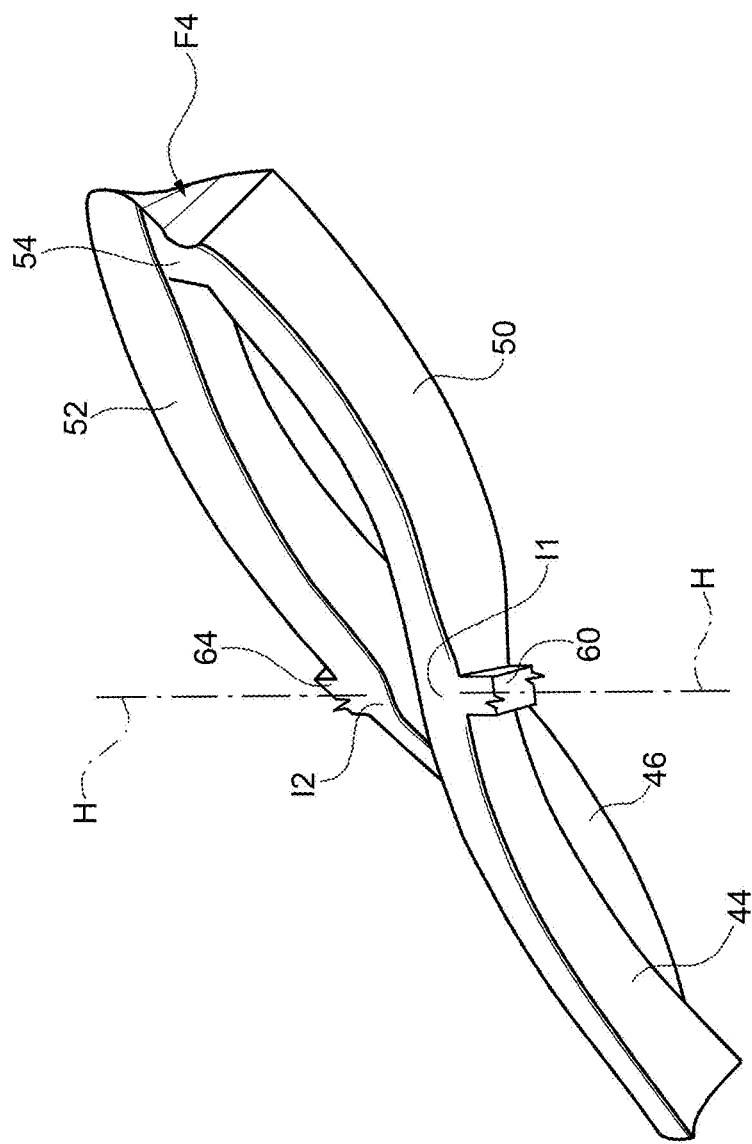
FIG. 8 is a perspective view of a portion of the MEMS device shown in FIG. 2, said portion being subject to an amplified deformation.

In particular, as visible in FIG. 8, which respect to a first approximation the same step illustrated in FIG. 5 (with amplified deformation, for greater clarity), the third elongated portion 50 tends to curve upwards. In other words, designating by F4 a fourth face, which delimits the second ends of the third and fourth elongated portions 50, 52 and the second connecting portion 54, this fourth face F4 tends to rise by an amount equal to $\Delta z'$ and to rotate by an angle equal to $\Delta rot'$ (in the clockwise direction, as viewed from the mobile element 32). Further, the fourth elongated portion 52 curves downwards. In the absence of the first semiconductive part 40, this curvature would tend to cause translation downwards of the intermediate portion of the second transverse element 62 (designated by I2 in FIG. 8), by an amount equal to $\Delta z''$, with respect to the resting conditions.

In practice, the deformations undergone by the first and second semiconductive parts 40, 42 tend to cause translation of the intermediate portion I2 of the second transverse element 62 (and thus, the axis H) parallel to the axis z by the same amount, but in opposite directions. Consequently, to a first approximation these translations, which are approximately equal in modulus, compensate one another. Thus, the intermediate portion I2 of the second transverse element 62 remains at the same height, as likewise the second coupling element 64 and the mobile element 32, which are fixed with respect to this intermediate portion.

In addition, the deformations undergone by the first and second semiconductive parts 40, 42 tend to cause rotation of the intermediate portion I2 of the second transverse element 62 about the axis H, in a concordant way. Consequently, with respect to the resting conditions, the intermediate portion I2 of the second transverse element 62 rotates by an amount equal to $2 \cdot \Delta rot''$, as also the second coupling element 64, the mobile element 32, and the mirror 35.

As regards the intermediate portion (designated by I1 in FIG. 8) of the first transverse element 56, it is not subject either to translations or to rotations.

In practice, FIG. 8 shows that the first and fourth piezoelectric elements 70, 76 curve the underlying first and fourth elongated portions 44, 52 so that they will assume a concavity facing approximately downwards, whereas the second and third piezoelectric elements 72, 74 curve the underlying second and third elongated portions 46, 50 so that they will assume a concavity facing approximately upwards.

The advantages that the present MEMS device affords emerge clearly from the foregoing description. In particular, the MEMS device enables rotation of a mobile element by piezoelectric actuators, which may be controlled with relatively low voltages and have a substantially linear behavior.

Finally, it is clear that modifications and variations may be made to what has been described and illustrated herein, without thereby departing from the scope of the present invention, as defined in the annexed claims.

For example, the shapes, number and arrangement of the deformable actuators may be different from what has been described (for example, a single deformable actuator may be present, in which case the other end of the mobile element is connected, for example, to a spring without piezoelectric actuators). Further, each deformable actuator may comprise a number of springs arranged in series, each spring being coupled to a corresponding quartet of piezoelectric elements.

Regarding the MEMS system, it is possible for it to be formed in a single die, in which case the driving circuit 104 is integrated in the first die 20.

Finally, it is possible for the first, second, third, and fourth elongated portions 44, 46, 50, 52 and the first and second connecting portions 48, 54 to have shapes different from the ones described.

The invention claimed is:

1. A MEMS device, comprising:
a fixed supporting body forming a cavity;
a mobile element suspended over the cavity;
at least one elastic element arranged between the fixed supporting body and the mobile element;
wherein the fixed supporting body has first and second opposing sides, and first and second opposing ends connecting the first and second opposing sides, the fixed supporting body being spaced apart from the mobile element along the first and second sides without intervening structures and being spaced apart from the at least one elastic element with the at least one elastic element being positioned between one of the first and second opposing ends and the mobile element; and
a first piezoelectric element, a second piezoelectric element, a third piezoelectric element, and a fourth piezoelectric element that are mechanically coupled to the at least one elastic element;
wherein said at least one elastic element has a shape symmetrical with respect to a first direction, which defines a first part and a second part of said at least one elastic element;
wherein the first and second piezoelectric elements are arranged on said first part, symmetrically with respect to the third and fourth piezoelectric elements, respectively, which are arranged on said second part;
wherein the first and fourth piezoelectric elements are configured to receive a first control signal; and wherein the second and third piezoelectric elements are configured to receive a second control signal, the first and second control signals being opposite in phase so that said first, second, third, and fourth piezoelectric elements deform the at least one elastic element, with consequent rotation of the mobile element, with respect to the fixed supporting body, about said first direction.

2. The MEMS device according to claim 1, wherein said at least one elastic element comprises:
a first transverse portion and a second transverse portion which extend parallel to a second direction, transverse with respect to said first direction;
a first connecting portion and a second connecting portion, that connects corresponding ends of the first and second transverse portions;
wherein the first and third piezoelectric elements are arranged on the first transverse portion; and
wherein the second and fourth piezoelectric elements are arranged on the second transverse portion.

3. The MEMS device according to claim 2, wherein the first and second transverse portions form, respectively, a first intermediate portion which is connected to the fixed supporting body, and a second intermediate portion which is aligned to the first intermediate portion in the first direction and is fixed to the mobile element, said second intermediate portion being configured to rotate, in use, with respect to the fixed supporting body.

4. The MEMS device according to claim 3, wherein, in resting conditions, each of said first, second, third and fourth piezoelectric elements has an elongated shape parallel to said second direction; wherein the first and third piezoelectric elements are laterally staggered with respect to the first intermediate portion; and wherein the second and fourth piezoelectric elements are laterally staggered with respect to the second intermediate portion.

5. The MEMS device according to claim 4, wherein the second direction is perpendicular to the first direction; and wherein said at least one elastic element has a thickness, measured along a third direction perpendicular to the first and second directions, that is smaller than two other dimensions, measured along the first and second directions.

6. The MEMS device according to claim 1, wherein the fixed supporting body, the at least one elastic element, and the mobile element are made of semiconductor material.

7. The MEMS device according claim 1, further comprising a driving circuit being electrically coupled to the first, second, third, and fourth piezoelectric elements and configured to generate said first and second control signals.

8. The MEMS device according to claim 7, wherein said fixed supporting body, said mobile element, said at least one elastic element, and said first, second, third, and fourth piezoelectric elements are formed in a first die; and wherein said driving circuit is formed in a second die.

9. The MEMS device according to claim 1, further comprising a mirror affixed to the mobile element.

10. The MEMS device of claim 1, wherein the fixed supporting body is spaced apart from the mobile element along the entire length of its first and second sides without intervening structures.

11. A projective MEMS system, comprising:
a MEMS device comprising:
a fixed supporting body forming a cavity;
a mobile element suspended over the cavity;
a mirror affixed to the mobile element;
at least one elastic element, arranged between the fixed supporting body and the mobile element;

wherein the fixed supporting body has first and second opposing sides, and first and second opposing ends connecting the first and second opposing sides, the fixed supporting body being spaced apart from the mobile element along the first and second sides without intervening structures and being spaced apart from the at least one elastic element with the at least one elastic element being positioned between one of the first and second opposing ends and the mobile element; and
a first piezoelectric element, a second piezoelectric element, a third piezoelectric element, and a fourth piezoelectric element, that are mechanically coupled to the at least one elastic element;
wherein said at least one elastic element has a shape symmetrical with respect to a first direction, which defines a first part and a second part of said at least one elastic element;
wherein the first and second piezoelectric elements are arranged on said first part, symmetrically with respect to the third and fourth piezoelectric elements, respectively, which are arranged on said second part;
wherein the first and fourth piezoelectric elements are configured to receive a first control signal; and
wherein the second and third piezoelectric elements are configured to receive a second control signal, the first and second control signals being opposite in phase so that said first, second, third, and fourth piezoelectric elements deform the at least one elastic element, with consequent rotation of the mobile element, with respect to the fixed supporting body, about said first direction;
a driving circuit electrically coupled to the first, second, third, and fourth piezoelectric elements and configured to generate said first and second control signals; and
at least one optical source configured to emit an optical beam and being optically coupled to the MEMS device so that said mirror reflects said optical beam.

12. The projective MEMS system according to claim 11, wherein said fixed supporting body, said mobile element, said at least one elastic element, and said first, second, third, and fourth piezoelectric elements are formed in a first die; and wherein said driving circuit is formed in a second die.

13. The projective MEMS system according to claim 11, wherein said at least one elastic element has an annular shape and comprises:
a first transverse portion and a second transverse portion which extend parallel to a second direction, transverse with respect to said first direction;
a first connecting portion and a second connecting portion that connects corresponding ends of the first and second transverse portions;
wherein the first and third piezoelectric elements are arranged on the first transverse portion; and
wherein the second and fourth piezoelectric elements are arranged on the second transverse portion.

14. The projective MEMS system according to claim 13, wherein the first and second transverse portions form, respectively, a first intermediate portion which is connected to the fixed supporting body, and a second intermediate portion which is aligned to the first intermediate portion in the first direction and is fixed to the mobile element, said second intermediate portion being configured to rotate, in use, with respect to the fixed supporting body.

15. The projective MEMS system according to claim 14, wherein, in resting conditions, each of said first, second, third and fourth piezoelectric elements has an elongated shape parallel to said second direction; wherein the first and third piezoelectric elements are laterally staggered with respect to the first intermediate portion; and wherein the second and fourth piezoelectric elements are laterally staggered with respect to the second intermediate portion.

16. A MEMS device, comprising:
a fixed supporting body forming a cavity;
a mobile element suspended over the cavity;
a first elastic element mechanically coupling the fixed supporting body and the mobile element, the first elastic element having an annular shape that is symmetrical with respect to a first direction to define a first part and a second part of the first elastic element;
a first piezoelectric element, a second piezoelectric element, a third piezoelectric element, and a fourth piezoelectric element that are mechanically coupled to the first elastic element;
wherein the first and second piezoelectric elements are arranged on said first part of the first elastic element, symmetrically with respect to the third and fourth piezoelectric elements, respectively, which are arranged on said second part of the first elastic element;
a second elastic element mechanically coupling the fixed supporting body and the mobile element, the second elastic element having an annular shape that is symmetrical with respect to the first direction to define a first part and a second part of the second elastic element;
a fifth piezoelectric element, a sixth piezoelectric element, a seventh piezoelectric element, and an eighth piezoelectric element, each being mechanically coupled to the second elastic element;
wherein the fifth and sixth piezoelectric elements are arranged on said first part of the second elastic element, symmetrically with respect to the seventh and eighth piezoelectric elements, respectively, which are arranged on said second part of the second elastic element;
wherein the first and second elastic elements are respectively located adjacent opposite sides of the fixed supporting cavity such that the first and second elastic elements are across the mobile element from one another;
wherein the first and fourth piezoelectric elements are configured to receive a first control signal; and
wherein the second and third piezoelectric elements are configured to receive a second control signal, the first and second control signals being opposite in phase so that said first, second, third, and fourth piezoelectric elements deform the first elastic element, with consequent rotation of the mobile element, with respect to the fixed supporting body, about said first direction.

17. The MEMS device according to claim 16, wherein said first elastic element has an annular shape and comprises:
a first transverse portion and a second transverse portion which extend parallel to a second direction, transverse with respect to said first direction;
a first connecting portion and a second connecting portion, each of which connects corresponding ends of the first and second transverse portions;
wherein the first and third piezoelectric elements are arranged on the first transverse portion; and
wherein the second and fourth piezoelectric elements are arranged on the second transverse portion.

18. The MEMS device according to claim 17, wherein the first and second transverse portions form, respectively, a first intermediate portion which is connected to the fixed supporting body, and a second intermediate portion which is aligned to the first intermediate portion in the first direction and is fixed to the mobile element, said second intermediate portion being configured to rotate, in use, with respect to the fixed supporting body.

19. The MEMS device according to claim 18, wherein, in resting conditions, each of said first, second, third and fourth piezoelectric elements has an elongated shape parallel to said second direction; wherein the first and third piezoelectric elements are laterally staggered with respect to the first intermediate portion; and wherein the second and fourth piezoelectric elements are laterally staggered with respect to the second intermediate portion.

20. The MEMS device according to claim 19, wherein the second direction is perpendicular to the first direction; and wherein said first elastic element has a thickness, measured along a third direction perpendicular to the first and second directions, that is smaller than two other dimensions, measured along the first and second directions.

21. The MEMS device according to claim 16, wherein the fixed supporting body, the first elastic element, and the mobile element are made of semiconductor material.

22. The MEMS device according claim 16, further comprising a driving circuit being electrically coupled to the first, second, third, and fourth piezoelectric elements and configured to generate said first and second control signals.

23. The MEMS device according to claim 22, wherein said fixed supporting body, said mobile element, said first elastic element, and said first, second, third, and fourth piezoelectric elements are formed in a first die; and wherein said driving circuit is formed in a second die.

24. The MEMS device according to claim 16, further comprising a mirror affixed to the mobile element.

* * * * *